(12) United States Patent
Muskatblit et al.

(10) Patent No.: US 12,301,233 B2
(45) Date of Patent: May 13, 2025

(54) ULTRA LOW LATENCY PATTERN MATCHING SYSTEM AND METHOD

(71) Applicant: Morgan Stanley Services Group Inc., New York, NY (US)

(72) Inventors: Igor G. Muskatblit, Mountain View, CA (US); Michael Gorbovitski, New York, NY (US); Joshua N. Elijah, London (GB)

(73) Assignee: Morgan Stanley Services Group Inc., New York, NY (US)

( * ) Notice: Subject to any disclaimer, the term of this patent is extended or adjusted under 35 U.S.C. 154(b) by 0 days.

(21) Appl. No.: 18/795,954

(22) Filed: Aug. 6, 2024

(65) Prior Publication Data

US 2025/0055462 A1  Feb. 13, 2025

Related U.S. Application Data

(60) Provisional application No. 63/517,980, filed on Aug. 7, 2023.

(51) Int. Cl.
  *G06F 11/00* (2006.01)
  *H03K 19/17704* (2020.01)
  *H03K 19/17792* (2020.01)

(52) U.S. Cl.
  CPC . *H03K 19/17792* (2013.01); *H03K 19/17708* (2013.01)

(58) Field of Classification Search
  CPC .................. H03K 19/17708; H03K 19/17792
  See application file for complete search history.

(56) References Cited

U.S. PATENT DOCUMENTS

| | | | |
|---|---|---|---|
| 8,554,953 B1* | 10/2013 | Sorensen | A61B 5/7267 714/49 |
| 10,114,777 B1* | 10/2018 | Owen | G06F 16/275 |
| 10,778,228 B1 | 9/2020 | Ossman | |
| 11,106,849 B2* | 8/2021 | Giordano | H03K 19/17768 |
| 2004/0181714 A1* | 9/2004 | Jungerman | H04L 1/20 714/704 |
| 2015/0063119 A1 | 3/2015 | Subramanian | |
| 2019/0140979 A1 | 5/2019 | Levi et al. | |

OTHER PUBLICATIONS

International Search Report and Written Opinion for corresponding PCT Application No. PCT/US2024/041227 mailed on Nov. 5, 2024 (8 pages).

* cited by examiner

*Primary Examiner* — Kurtis R Bahr
(74) *Attorney, Agent, or Firm* — Leason Ellis LLP

(57) ABSTRACT

In one or more implementations, a data processing device and a data processing method are disclosed that includes a data communication port configured to transmit and receive data to and from at least one computing device. Further, a replicator is included that is configured to replicate ingress data received from the data communication port to a pattern matcher and a field programmable gate array. The pattern matcher is configured to receive the replicated data directly from the replicator and to generate and transmit a trigger signal to the field programmable gate array. Still further, the field programmable gate array is configured to receive the replicated data from the replicator and the trigger signal from the pattern matcher and to perform bit operations on the replicated data as a function of the trigger signal.

18 Claims, 8 Drawing Sheets

ULTRA LOW LATENCY PATTERN MATCHING SYSTEM AND METHOD

CROSS-REFERENCE TO RELATED APPLICATIONS

This application is based on and claims priority to U.S. Provisional Patent Application No. 63/517,980, filed Aug. 7, 2023, the contents of which is incorporated by reference in its entirety, as if set forth herein.

FIELD

The present disclosure relates, generally, to data communication networking and, more particularly, to a system and method for providing latency reduction in high-speed data pattern matching operations.

BACKGROUND

Many networking applications involve data access, use, analysis, processing, and transmission, but cannot operate efficiently due to latency, particularly in highly competitive industries in which speed of operations is paramount. Many networked environments, including data centers or other remotely located, high traffic settings, use 10G Ethernet and other topologies. Traditionally such systems are built using software and have response times on the order of 100 μs or more. More recently, systems incorporate the use of field programmable gate arrays ("FPGAs") and application specific integrated circuit ("ASICs"), which can reduce latency to 100 ns or less.

Unfortunately, a tradeoff exists between reducing latency and the complexity of various data processing operations. Increasingly complex processing operations incur more latency, which results in longer periods to respond. Unfortunately, reducing latency in certain high data processing contexts is often not possible.

It is with respect to these and other considerations that the disclosure made herein is presented.

BRIEF SUMMARY

In one or more implementations, a data processing device and a data processing method are disclosed that includes a data communication port configured to transmit and receive data to and from at least one computing device. Further, a replicator is included that is configured to replicate ingress data received from the data communication port to a pattern matcher and a field programmable gate array. The pattern matcher is configured to receive the replicated data directly from the replicator and to generate and transmit a trigger signal to the field programmable gate array. Still further, the field programmable gate array is configured to receive the replicated data from the replicator and the trigger signal from the pattern matcher and to perform bit operations on the replicated data as a function of the trigger signal.

In one or more implementations, the data processing device and method include a line rate descrambler that is configured to descramble the replicated data prior to deserialization.

In one or more implementations of the data processing device and method, the line rate descrambler uses a bit-slip mechanism.

In one or more implementations of the data processing device and method, the line rate descrambler is configured to remove header data.

In one or more implementations of the data processing device and method, the line rate descrambler is configured to remove the header data without a gearbox.

In one or more implementations of the data processing device and method, the trigger signal is generated as a function of a comparison word.

In one or more implementations, the data processing device and method includes a sense and response loop executing within the field programmable gate array.

In one or more implementations of the data processing device and method, the pattern matcher is configured with discrete electrical components or optical components.

In one or more implementations of the data processing device and method, the field programmable gate array comprises a transceiver having a physical coding sublayer.

BRIEF DESCRIPTION OF THE DRAWINGS

Aspects of the present disclosure will be more readily appreciated upon review of the detailed description of its various embodiments, described below, when taken in conjunction with the accompanying drawings, of which.

DETAILED DESCRIPTION

By way of overview and introduction, the present disclosure provides a system that operates to reduce latency as a function of pattern matching in a data stream. In one or more implementations, a field programmable gate array ("FPGA") is included and bits from a serial data stream can be compared and matched via discrete components, and a trigger signal based on the value of the bits can be generated and used by a FPGA for further processing. Although many of the examples and descriptions shown and described herein regard use of a FPGA, the present disclosure is not limited thereto. Other components, such as integrated circuits, can be used in conjunction with or in place of a FPGA.

The arrangements shown and described herein reduce data processing operations to simple comparisons, which operate directly on the serial data stream either at line rate or at a minimally reduced clock rate. This results in systems and methods that are particularly useful in applications requiring decisions to be made on simple bit patterns at very low latencies.

In particular implementations, systems and methods are provided which include the use of various components, including a FPGA, which perform low latency bit operations on an incoming 10G ethernet data stream. Unlike known systems, in which a FPGA operates on an entire data stream, the present disclosure includes arrangements of a plurality of components that provide operations to reduce operations performed by the FPGA.

Figure 1:
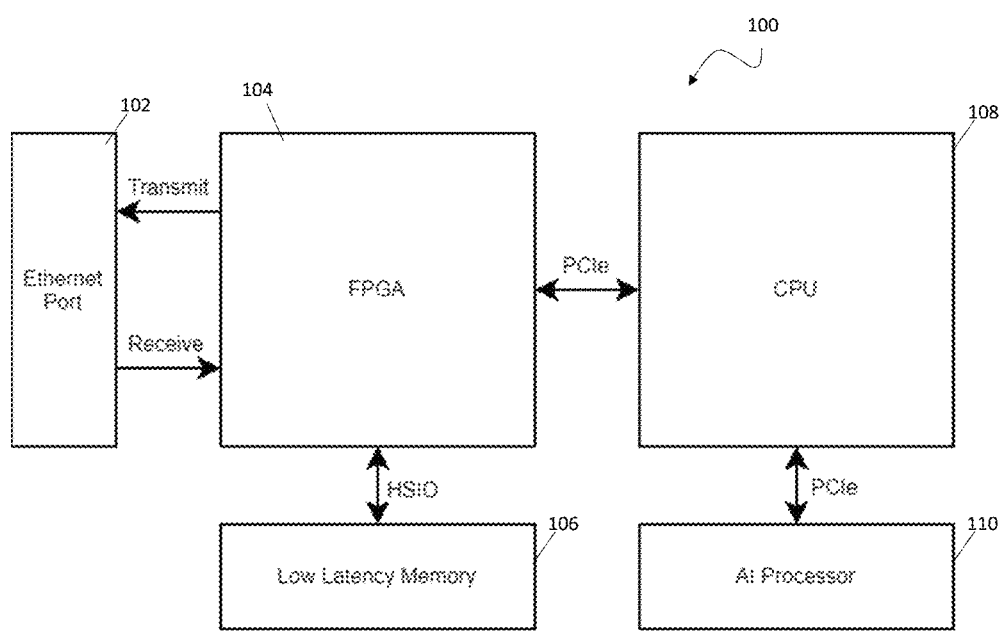
FIG. 1 illustrates a simplified implementation of an FPGA-based processing system, in accordance with an example implementation of the present disclosure.

Referring to FIG. 1, a simplified implementation of a FPGA-based processing system 100 is shown. In the example shown in FIG. 1, an ethernet port 102 provides access to an external network, to which a FPGA 104 connects via 10G ethernet, which can be a full duplex connection. The FPGA 104 can be connected to low latency memory 106, which is usable to store and/or load information needed for interaction with the external network. Specific kinds of information stored and/or loaded can depend on the respective application being executed by the implementation. In one or more implementations, a sense and response loop can exist within the FPGA 104 and allows low latency responses to events in the network. In addition, the CPU 108 connects to the FPGA 104 over PCIe, a higher latency bus, and provides more complex data analysis, often with the help of a co-processor 110 (illustrated as "AI Processor").

It is recognized herein that certain applications may not require much data analysis, such as in the example of a simple equality (==) evaluation. In such instances, evaluations can require very little computation and be reduced to a simple comparison of bits. Using a FPGA can be preferable for being much faster than performing operations on a CPU.

The present disclosure provides a system of components for performing simple bit operations on data streams received via 10G. This allows simple logic operations to be performed outside of the FPGA 104 and results in significantly lower latency. The FPGA-based processing system 100 illustrated in FIG. 1 provides a layered approach that is beneficial by allowing the FPGA 104 to handle specific data-related events extremely quickly (e.g., less than 100 ns), and allowing other processing to be performed by the CPU 108, which can analyze data and provide data for the FPGA, albeit at a higher latency (e.g., at around 100 μs).

Figure 2:
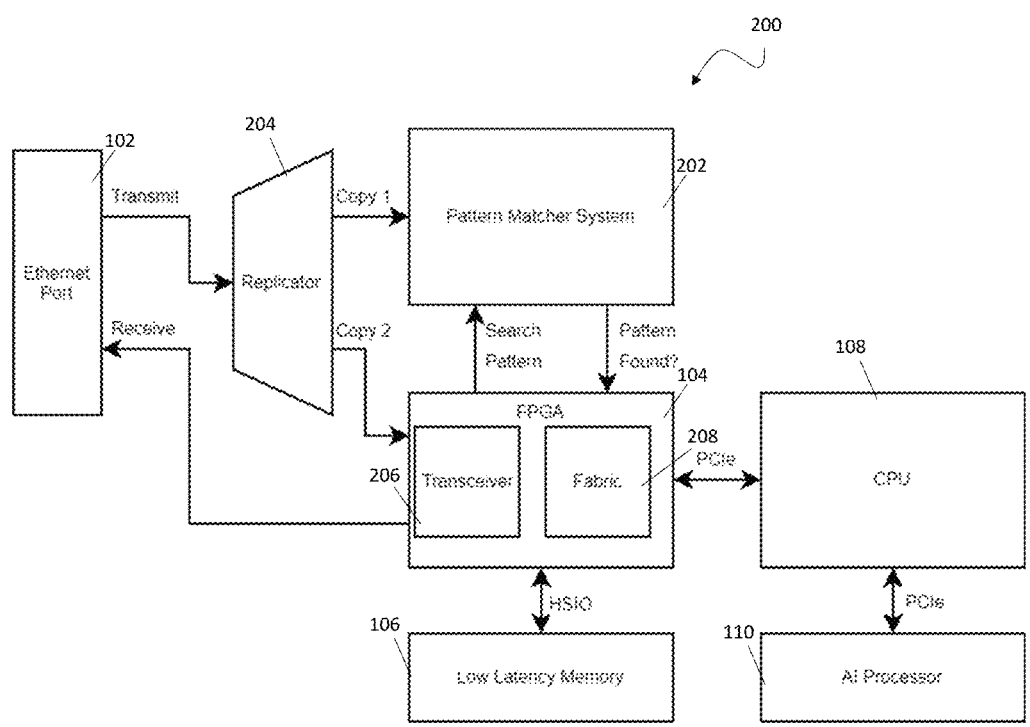
FIG. 2 shows a simplified implementation of a FPGA-based processing system that includes components shown with reference to FIG. 1 and includes a pattern matcher system, in accordance with an example implementation of the present disclosure.

Referring now to FIG. 2, a FPGA-based processing system 200 is illustrated that includes components shown and described above with reference to FIG. 1, and includes an external pattern matcher system 202. The pattern matcher system 202 can be configured as an electrical or optical system, with discrete components and/or an integrated circuit. In operation, the number of bits processed by system 200 can be virtually unlimited, albeit the rate of such processing can be limited by practical capabilities, including whether system 200 includes custom integrated electrical or optical circuits. In one or more implementations, an optical circuit can be included, which can reduce overall latency and power consumption. Alternatively (or in addition), an electrical circuit can be advantageous in terms of performing nonlinear, binary operations. In operation, the pattern matcher 202 can compare data without a need to use the FPGA's transceiver 206 or otherwise be constrained by the clock rate of the FPGA's fabric 208, which may operate at a maximum of 644 MHz. Accordingly, the FPGA-based system 200 achieves basic bit pattern matching at a lower latency than a FPGA 204 solely can achieve.

Moreover, the present disclosure can include a replicator 204 positioned "in front" of the FPGA 104. The FPGA system 200 shown in FIG. 2 does not include a direct FPGA incoming connection to ethernet port 102 and, instead, includes a replicator 204 and pattern matcher system 202. In operation, the replicator 204 operates on the incoming serial data stream, including to copy and provide copies of the incoming signal to be passed to the FPGA 104 and to the pattern matcher system 202. The pattern system 202 can include a set of components that operate on incoming data at line rate or at a minimally reduced clock frequency. At a high level, the pattern matcher system 202 receives a search pattern from the FPGA 104 that corresponds to a specific pattern of bits in a specific location. The pattern matcher system 202 outputs a signal back to the FPGA 104 representing whether the pattern was found. Alternatively, or in addition, a signal representing a found pattern can be fed back to a switch device or sent down stream to the FPGA or AI chip 110, for example.

Figure 3:
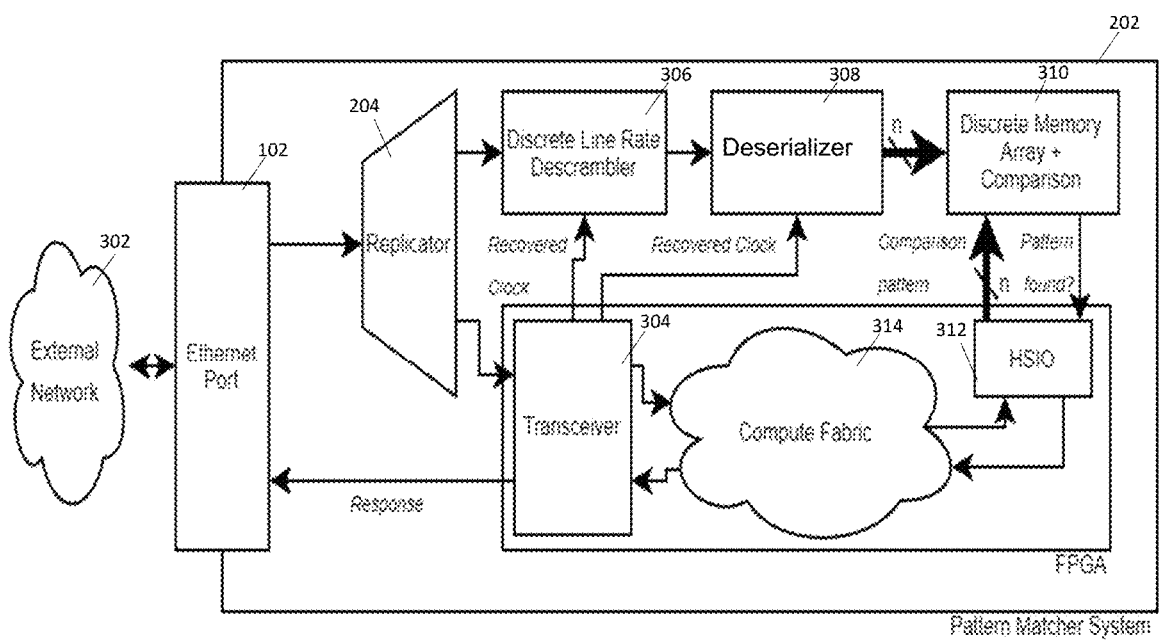
FIG. 3 illustrates example components included in a pattern matcher system shown and described with reference to FIG. 2, in accordance with an example implementation of the present disclosure.

Referring now to FIG. 3, example components included in a pattern matcher system 202 are illustrated. As illustrated in FIGS. 1 and 2, a subcomponent of the system is the ethernet port 102. In one or more implementations, ethernet port 102 is a full duplex interface between the FPGA-based system 100 and an external network 302. The external network 302 can include multiple computing devices (not shown), which send and receive data over external network 302.

In operation, incoming data from the external network 302 are received and replicated to two identical copies by replicator 204. One copy is sent to the FPGA's transceiver 304. The transceiver 304 can include a standard physical coding sublayer ("PCS"), through which clock recovery, deserialization, block synchronization and descrambling can be performed to convert incoming scrambled data into raw parallel words. The clock that the FPGA 104 recovers from the data is exported out from the FPGA 104 and used to drive the external system components. Thus, a single recovered clock can be the sole clocking source for the pattern matching system 202, which can prevent issues related to multiple clock domains.

In parallel to the FPGA's transceiver 304, the second copy of the data can be input into a line rate transceiver 306, which can be an electrical or optical system that performs descrambling on the incoming ethernet signal. Note that scrambling/descrambling is a reversible process in which data is fed through a linear feedback shift register to generate a pseudo-random sequence. Once the process of descrambling is undone by the discrete line rate descrambler 306, a serial stream of raw unscrambled bits can be presented to the next stage of the system.

Continuing with reference to FIG. 3, deserializer 308 generates parallel n-bit width words from the incoming raw data stream. In operation, the specific width of the words can be virtually any number, but practically is a power of 2 and less than 16 bits, to minimize latency associated with waiting for all bits to be parallelized. The deserializer 308 can operate to provide a slower stream of bits in parallel that can be used to compare against a known signal. It is to be noted that, in one or more implementations, this component can be omitted and, instead, the bits can be compared at line rate. Omitting the deserializer 308, however, requires a comparison pattern to be able to output comparisons at line rate, which is time-consuming or otherwise difficult to be accomplished by a typical FPGA.

Continuing with reference to FIG. 3, once deserialized, parallel words of bits can be presented to a discrete array of memory 310, which can be stored. In an implementation of an electrical system, this could take the form of an array of flip flops. In an implementation of an optical system, this could take the form of an array of delay lines. The bits can be stored and then a comparison circuit compares the word against a prediction word sent from the FPGA 104. The comparison circuit can take the form of an array of XOR gates, for example. The XOR gates can generate logic level signals that indicate whether the comparison pattern from the FPGA 104 was found. In this way, the system allows the FPGA 104 to see if a specific pattern can be found in the data, without the data needing to be directly input to the FPGA 104. In effect, the present disclosure relies on the FPGA 104 being able to read the existing data and "predict ahead" a comparison pattern.

In a typical PCS existing within a FPGA or similar network device, descrambling processes occur after an initial deserialization and block synchronization process. This is because descrambling requires basic digital logic to achieve (XOR gates and flip flops), and there is a speed limit of how fast such logic can run inside a FPGA. In accordance with one or more implementations, the FPGA 104 can implement logic to determine where sync headers are located in a data stream and to output a gapped clock, which can be used by the line rate descrambler to avoid the sync headers. One of ordinary skill in the art will recognize that both the FPGA 104 and the pattern matcher system 202 are synchronized to the same incoming ethernet signal, including as a function of identifying a fixed delay.

Figure 4A:
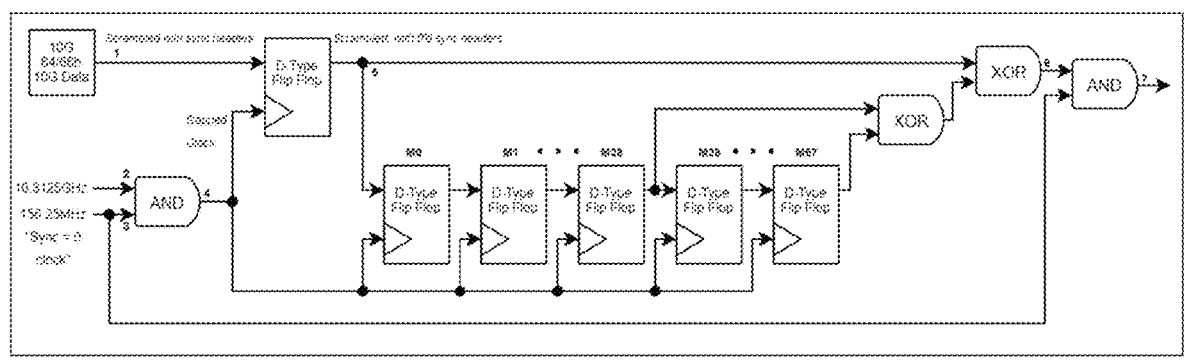
FIG. 4A illustrates an electrical implementation of a line rate descrambler, in accordance with an example implementation of the present disclosure.
Figure 4B:
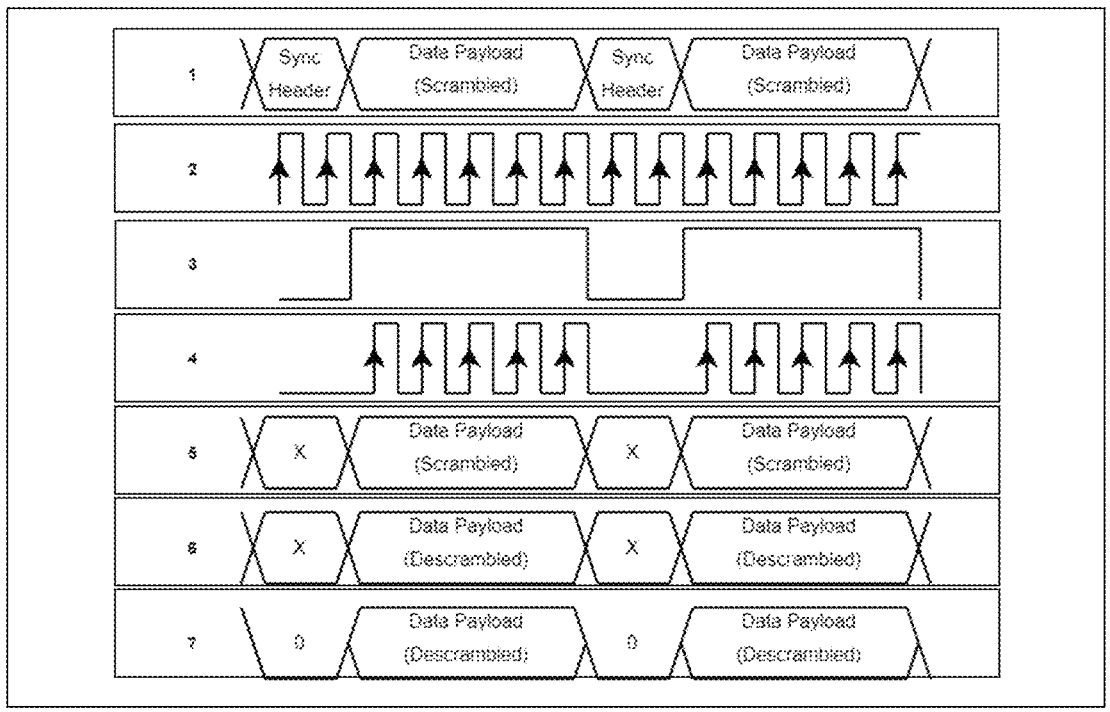
FIG. 4B is a timing diagram illustrating signals in various stages of the system with reference to the implementation shown in FIG. 4A, in accordance with an example implementation of the present disclosure.

Referring now to FIG. 4A, an electrical implementation of a line rate descrambler is illustrated that implements a bit-slip mechanism to prevent sync header bits from entering the descrambler. In FIG. 4B, a timing diagram is shown of signals that are in various stages of the system in accordance with the implementation shown in FIG. 4A. In accordance with the present disclosure, a gapped clock is used which is generated by ANDing the high-speed clock with a lower speed sync clock, which goes low each time the sync bits are sent. Both signals can be derived from the recovered clock of the 10G ethernet signal, and can be generated and output via the FPGA 104. The gapped clock ensures that only the data payload bits proceed through a linear feedback shift register (LFSR)-based descrambler, while the sync bits are missed. This prevents the sync bits (which are unscrambled) from interfering with the descrambling process. Although the gapped clock prevents sync header bits from interfering with the LFSR and memory of the system, the gapped clock does not prevent the bits from appearing on the XOR gates, thus, appearing as erroneous data at the output. Accordingly, the present disclosure includes adding a final AND gate at the output stage to force the output bits to zero where they would have otherwise been erroneous.

The FPGA-based processing system of the present disclosure is unlike typical descrambling processes, in which bits are deserialized, gearboxed, and sync headers removed, which results in framed descrambled data. In accordance with the present disclosure the sync bits are zero'd and the data are descrambled. The operations occur at line rate and gaps exist in the data where the sync headers used to be. The present disclosure is effective via a structural approach that relies on the FPGA 104 to provide necessary clocking signals, which are usable to inform circuitry where the sync bits are, as well as to provide a stable high-speed clock. The FPGA 104 performs clock and data recovery and outputs signals, which simplifies the external logic considerably. In one or more implementations of the present disclosure, the timing skew from the FPGA 104 to the external system is known and minimally variable.

Figure 5:
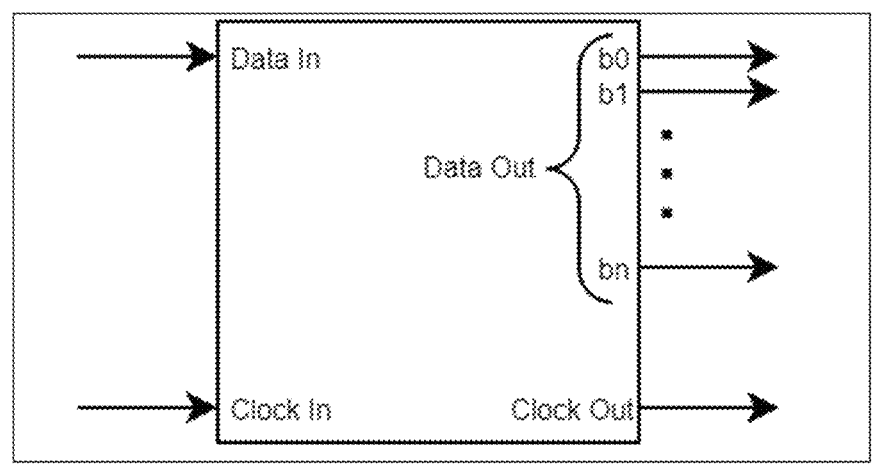
FIG. 5 is a simplified diagram of an example deserializer, shown and described with reference to FIG. 3, in accordance with an example implementation of the present disclosure.

FIG. 5 is a simplified diagram of a deserializer 308. During processing, an incoming descrambled data stream can be deserialized for processing as parallel streams. In one or more implementations, this step can be omitted, for example, in case the pattern matcher system 202 outputs comparison words at line rate. For descriptive purposes, FPGA 104 can be used to output comparisons, which may be more practical, in parallel at a lower clock rate. In the example shown in FIG. 5 a simple deserializer component is provided, which can be configured electrically using a discrete integrated circuit ("IC"), or optically using an array of delay lines. Moreover, the deserializer can be clocked using the same gapped clock as shown and described in connection with FIGS. 4A and 4B, and empty bits can be removed.

Figure 6:
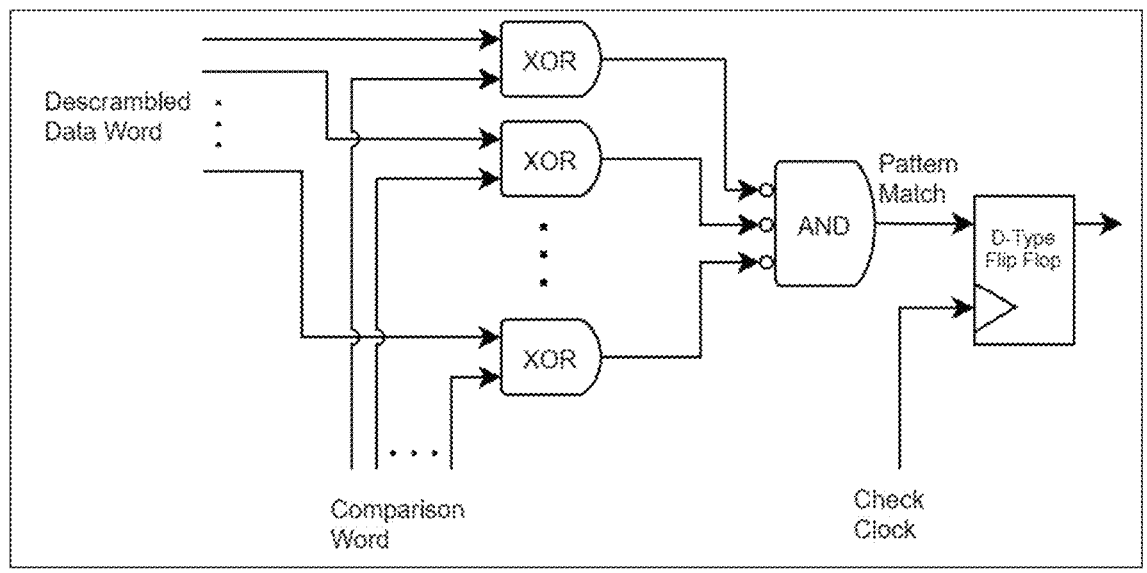
FIG. 6 illustrates an example, simple bit-wise pattern matcher that is configured electrically with a simple logic circuit and flip flop, in accordance with an example implementation of the present disclosure.

Referring now to FIG. 6, an example simple bit-wise pattern matcher is illustrated that is configured electrically with a simple logic circuit and flip flop. The present disclosure supports achieving a bit comparison separate from the FPGA 104, which can be achieved electrically using an arrangement such as illustrated in FIG. 6. The relatively straightforward example arrangement shown in FIG. uses XORs to detect bit differences between the descrambled data word and the comparison word. The output of the XORs is logic 0 when the bits are the same, and these bits are inverted and applied to the input of an AND gate. Thus, the AND gate only outputs logic 1 when the data word and comparison word match. Furthermore, a D-type flip flop can be added to latch a signal at the right time for comparison.

Accordingly, the pattern matcher, such as shown and described in connection with the example implementation shown in FIG. 6, At this point, this system has generated a trigger signal (or set of trigger signals) that can be fed back into the FPGA. This trigger signal can then be used to allow the FPGA to see patterns ahead of time.

A core tenet of the present disclosure includes the ability of the FPGA 104 to feed, coordinate, and to stay in sync with its current state via logic provided by one or more external components. The following describes an example implementation of the FPGA 104 (or other component, such as a central computing unit) achieving this task.

Figure 7:
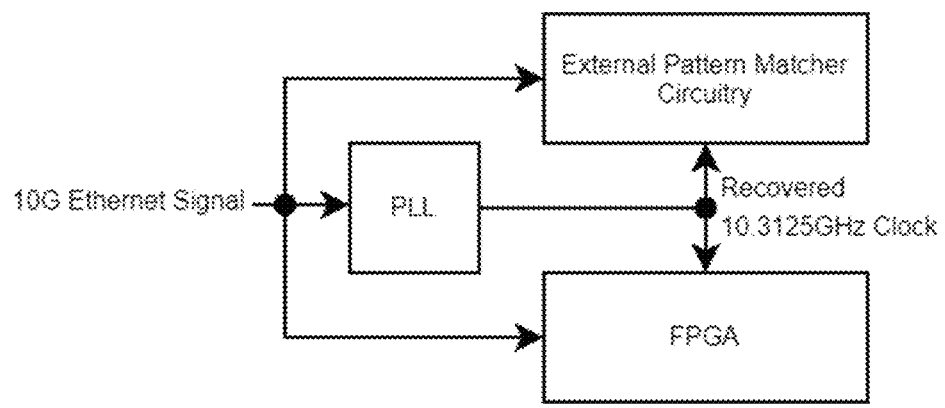
FIG. 7 illustrates an example implementation in which an external phase locked loop ("PLL") component can be used to generate a common synchronous clock from the incoming data, in accordance with the present disclosure.

FIG. 7 illustrates an example implementation using an external phase locked loop ("PLL") component to generate a common synchronous 10.3125 GHz clock from the incoming data. A computing unit can recover the underlying clock from the incoming data. For 10 Gbps ethernet, this clock is a 10.3125 GHz square wave signal. In typical FPGA transceivers, this clock is recovered using a PLL and the clock to feed a deserializer to parallelize the incoming serial data stream.

Once the FPGA 104 has recovered the clock, the FPGA 104 can export this clock to synchronize the external logic. In many cases the recovered clock can be a divided multiple of a fundamental 10.3125 GHz clock. The FPGA 104 can use this recovered clock to output a new serial stream of alternative 0 s and 1 s to generate a 10.3125 GHz clock that is synchronized to the recovered clock of the incoming ethernet stream. This synchronized clock can then be used in external logic processes.

Alternatively, instead of using the FPGA 104 to recover and generate the clock that drives this system, an external PLL can be used to generate a 10.3125 GHz clock to drive both the FPGA 104 and external circuitry. This configuration is advantageous over FPGA 104 used to generate the clock, as the jitter and timing specifications of the FPGA recovered clock may not be as accurate as that of a dedicated external PLL circuit, such as illustrated in the example implementation illustrated in FIG. 7. In addition to the 10.3125 GHz clock that can be used for deserialization in both the FPGA 104 and the external circuit, the external PLL can be combined with a configurable clock generator to generate any combination of clocks derived from the 10.3125 GHz clock. Such a clock generator is a common external component available electrically as an integrated circuit. This clock generator can be used to generate the necessary clocks shown in FIG. 4B.

As noted herein, the FPGA needs to know the time delay between the bits currently in the external pattern matcher and the bits currently in the FPGA's fabric to output a comparison pattern. One of ordinary skill will recognize that the bits in the fabric will be in some fixed delay behind the bits in the external pattern matcher. Since this delay is fixed and can be known, the FPGA can implement a look ahead algorithm that takes into account the current data in its fabric, the fixed delay, and the known structure of the data, to produce a pattern ahead of time.

Accordingly, as shown and described herein, the present disclosure provides for a pattern matching engine that is configured to be external to a standard computing device, and that can be implemented as discrete electrical or optical components. Further, a line rate descrambler configuration is supported in accordance with the present disclosure, that can use a bit-slip mechanism to descramble data prior to deserialization. Moreover, the present disclosure includes a bit-slipped deserialization method for removing sync headers without the need to use a gearbox. Additionally, a simple logic circuit is usable to produce a trigger signal based on a comparison word.

Furthermore, as shown and described herein, respective configurations in a replicator/switch device 102 are provided that include full traffic mirroring in an ethernet network with significant reduction in latency. In one or more implementations, a combined approach to achieving L1 and L2 switching and respective bypassing is supported, which can include fast path replication for lowest latency monitoring. Further, latency steering or gating can be provided as a function of respective physical distances of components set forth in a replicator/switch device 102. For example, by positioning replicating components away from the hot path, additional heat and corresponding latency can be avoided. Still further, implementations are supported herein in which a sort of free replicator can be realized as a function of otherwise unused negative signal of a circuit element, applied as an input to a 1:2 mux 602.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this disclosure, specify the presence of stated features, integers, steps, operations, elements, and/or components, but do not preclude the presence or addition of one or more other features, integers, steps, operations, elements, components, and/or groups thereof.

It should be noted that use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A data processing device, comprising:
   a data communication port configured to transmit and receive data to and from at least one computing device; and
   a replicator configured to receive ingress data from the data communication port and to replicate the received ingress data to a pattern matcher and a field programmable gate array,
   wherein the pattern matcher is configured by pattern information received from the field programmable gate array, and further wherein the pattern matcher is configured to generate and transmit, to the field programmable gate array, a trigger signal associated with any of the replicated data received from the replicator that match the pattern information, and;
   further wherein the field programmable gate array is configured to perform bit operations on at least some of the replicated data received from the replicator as a function of the trigger signal received from the pattern matcher.

2. The data processing device of claim 1, further comprising:
   a line rate descrambler that is configured to descramble the replicated data prior to deserialization.

3. The data processing device of claim 2, wherein the line rate descrambler uses a bit-slip mechanism.

4. The data processing device of claim 2, wherein the line rate descrambler is configured to remove header data.

5. The data processing device of claim 4, wherein the line rate descrambler is configured to remove the header data without a gearbox.

6. The data processing device of claim 1, wherein trigger signal is generated as a function of a comparison word.

7. The data processing device of claim 1, further comprising a sense and response loop executing within the field programmable gate array.

8. The data processing device of claim 1, wherein the pattern matcher is configured with discrete electrical components or optical components.

9. The data processing device of claim 1, wherein the field programmable gate array comprises a transceiver having a physical coding sublayer.

10. A data processing method, comprising:
    transmitting and receiving, by a data communication port, data to and from at least one computing device;
    replicating, by a replicator, ingress data received from the data communication port to a pattern matcher, wherein the pattern matcher is configured by pattern information received from a field programmable gate array,
    generating, by the pattern matcher, a trigger signal that is associated with any of the replicated data received from the replicator that match the pattern information;
    transmitting, by the pattern matcher, the trigger signal to the field programmable gate array;

receiving, by the field programmable gate array, the replicated data from the replicator and the trigger signal from the pattern matcher; and performing, by the field programmable gate array, bit operations on at least some of the replicated data received from the replicator as a function of the received trigger signal received from the pattern matcher.

11. The data processing method of claim 10, further comprising:

descrambling, by a line rate descrambler, the replicated data prior to deserialization.

12. The data processing method of claim 11, wherein the line rate descrambler uses a bit-slip mechanism.

13. The data processing method of claim 11, wherein the line rate descrambler is configured to remove header data.

14. The data processing method of claim 13, further comprising:

removing, by the line rate descrambler, the header data without a gearbox.

15. The data processing method of claim 10, wherein trigger signal is generated as a function of a comparison word.

16. The data processing method of claim 10, wherein the field programmable gate array includes a sense and response loop.

17. The data processing method of claim 10, wherein the pattern matcher is configured with discrete electrical components or optical components.

18. The data processing method of claim 10, wherein the field programmable gate array includes a transceiver having a physical coding sublayer.

* * * * *